United States Patent
Cases et al.

(10) Patent No.: US 7,759,958 B2
(45) Date of Patent: Jul. 20, 2010

(54) APPARATUS, SYSTEM, AND METHOD FOR INTEGRATED COMPONENT TESTING

(75) Inventors: Moises Cases, Austin, TX (US); Shiva R. Dasari, Austin, TX (US); Erdem Matoglu, Austin, TX (US); Bhyrav M. Mutnury, Austin, TX (US); Nam H. Pham, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 11/859,540

(22) Filed: Sep. 21, 2007

(65) Prior Publication Data

US 2009/0079456 A1    Mar. 26, 2009

(51) Int. Cl.
*G01R 31/02* (2006.01)
*G06F 17/50* (2006.01)
(52) U.S. Cl. .......................................... 324/763; 716/4
(58) Field of Classification Search .................. None
See application file for complete search history.

(56) References Cited

U.S. PATENT DOCUMENTS

| | | | |
|---|---|---|---|
| 6,121,786 A * | 9/2000 | Yamagami et al. | 324/765 |
| 6,489,912 B2 | 12/2002 | Lamb et al. | 341/155 |
| 6,515,917 B2 | 2/2003 | Lamb et al. | 365/189.09 |
| 6,707,724 B2 | 3/2004 | Kim et al. | 365/189.09 |
| 6,791,893 B2 | 9/2004 | Pekny et al. | 365/226 |
| 6,807,650 B2 | 10/2004 | Lamb et al. | 716/1 |
| 7,024,568 B2 | 4/2006 | Maksimovic et al. | 713/300 |
| 7,162,376 B2 | 1/2007 | Oh et al. | 702/57 |
| 7,444,490 B2 * | 10/2008 | Cases et al. | 711/167 |
| 2003/0201788 A1 * | 10/2003 | Sakaguchi et al. | 324/765 |
| 2006/0083079 A1 | 4/2006 | Hwang et al. | 365/189.09 |
| 2006/0280018 A1 * | 12/2006 | Cases et al. | 365/226 |
| 2009/0066303 A1 * | 3/2009 | Smith et al. | 323/274 |
| 2010/0014569 A1 * | 1/2010 | Cases et al. | 375/224 |

OTHER PUBLICATIONS

IBM, Realatime Level Referencing, IBM Technical Disclosure Bulletin, May 1984, Savaglio, RJ.

* cited by examiner

*Primary Examiner*—Jermele M Hollington
(74) *Attorney, Agent, or Firm*—Kunzler Needham Massey & Thorpe

(57) ABSTRACT

An apparatus, system, and method are disclosed for integrating component testing. A voltage module modifies a reference voltage integral to an electronic device to a plurality of reference voltage values. A test module tests a component of the electronic device at each of the plurality of reference voltage values. In addition, the test module determines a voltage range for the component, wherein the voltage range comprises voltage values between a high voltage failure and a low voltage failure. An optimization module sets the reference voltage value to within the voltage range.

20 Claims, 6 Drawing Sheets

APPARATUS, SYSTEM, AND METHOD FOR INTEGRATED COMPONENT TESTING

BACKGROUND OF THE INVENTION

1. Field of the Invention

This invention relates to component testing and more particularly relates to integrated component testing.

2. Description of the Related Art

Electronic devices such as computers often incorporate open standard components, hereinafter referred to as components. For example, a computer may employ dual in-line memory module (DIMM) components to store data.

Although components conform to common specifications, there may still be significant differences in the reliability and operational parameters of components. For example, a first DIMM may operate over a different voltage range from a second DIMM although there may be significant overlap in the voltage ranges.

In addition, different components may have different tolerances. For example, the first DIMM may operate optimally at 1.1 Volts, while the second DIMM operates optimally at 1.0 Volts.

Electronic devices may be produced with a wide variety of components options. For example, a first computer may be produced with a two hundred and fifty-six megabyte (256 MB) DIMM, while a second computer is produced with a one gigabyte (GB) DIMM. As a result it may be difficult to screen components. For example, the test may require specialized equipment and personnel. In addition, the test may only be performed after the component added to include the variability of the electronic device.

When components are screened, some components with low margins may pass. These components may later fail. The user of the electronic device may be uncertain as to why the electronic device failed. For example, a DIMM may pass a manufacturing test and be shipped to the user. The DIMM may later degrade, causing the computer to fail. The user may not know that the DIMM caused the computer to fail.

Alternatively, the user may add the component after receiving the electronic device from the manufacturer. However, the user may be uncertain if the electronic device is correctly configured for the component.

SUMMARY OF THE INVENTION

From the foregoing discussion, there is a need for an apparatus, system, and method for integrated component testing. Beneficially, such an apparatus, system, and method would support testing of the component in an electronic device.

The present invention has been developed in response to the present state of the art, and in particular, in response to the problems and needs in the art that have not yet been fully solved by currently available component testing methods. Accordingly, the present invention has been developed to provide an apparatus, system, and method for integrated component testing that overcome many or all of the above-discussed shortcomings in the art.

The apparatus for integrated component testing is provided with a plurality of modules configured to functionally execute the steps of modifying a reference voltage, testing a component, determining a voltage range, and setting a reference voltage value. These modules in the described embodiments include a voltage module, a test module, and an optimization module.

The voltage module is integrated within an electronic device. In addition, the voltage module modifies a reference voltage to a plurality of reference voltage values. The reference voltage is also integral to the electronic device.

The test module is integrated with the electronic device. In addition, the test module tests a component of the electronic device at each of the plurality of reference voltage values. The test module further determines a voltage range for the component. The voltage range comprises voltage values between a high voltage failure and a low voltage failure. The optimization module is integrated within the electronic device and sets the reference voltage value to within the voltage range.

A system of the present invention is also presented for integrated component testing. The system may be embodied in a computer. In one embodiment, the system includes a reference voltage generator, low voltage module, a test module, and an optimization module. The reference voltage generator generates a reference voltage. The voltage module modifies a reference voltage to a plurality of reference voltage values.

The test module tests a component of the electronic device at each of the plurality of reference voltage values. In addition, the test module determines a voltage range for the component. The voltage range comprises voltage values between a high voltage failure and a low voltage failure. The optimization module sets the reference voltage value to within the voltage range.

A method of the present invention is also presented for integrated component testing. The method in the disclosed embodiments substantially includes the steps to carry out the functions presented above with respect to the operation of the described apparatus and system. In one embodiment, the method includes modifying a reference voltage, testing a component, determining a voltage range, and setting a reference voltage value.

A voltage module modifies a reference voltage integral to an electronic device to a plurality of reference voltage values. A test module tests a component of the electronic device at each of the plurality of reference voltage values. In addition, the test module determines a voltage range for the component. The voltage range comprises voltage values between a high voltage failure and a low voltage failure. An optimization module sets the reference voltage value to within the voltage range.

References throughout this specification to features, advantages, or similar language do not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The present invention integrates components testing by modifying a reference voltage to determine a voltage range. In addition, the present invention sets the reference voltage value to within the voltage range. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification have been labeled as modules, in order to more particularly emphasize their implementation independence. Modules may include hardware circuits such as Very Large Scale Integration (VLSI) circuits, gate arrays, programmable logic, and/or discrete components. The hardware circuits may perform hardwired logic functions, execute computer readable programs stored on tangible storage devices, and/or execute programmed functions.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
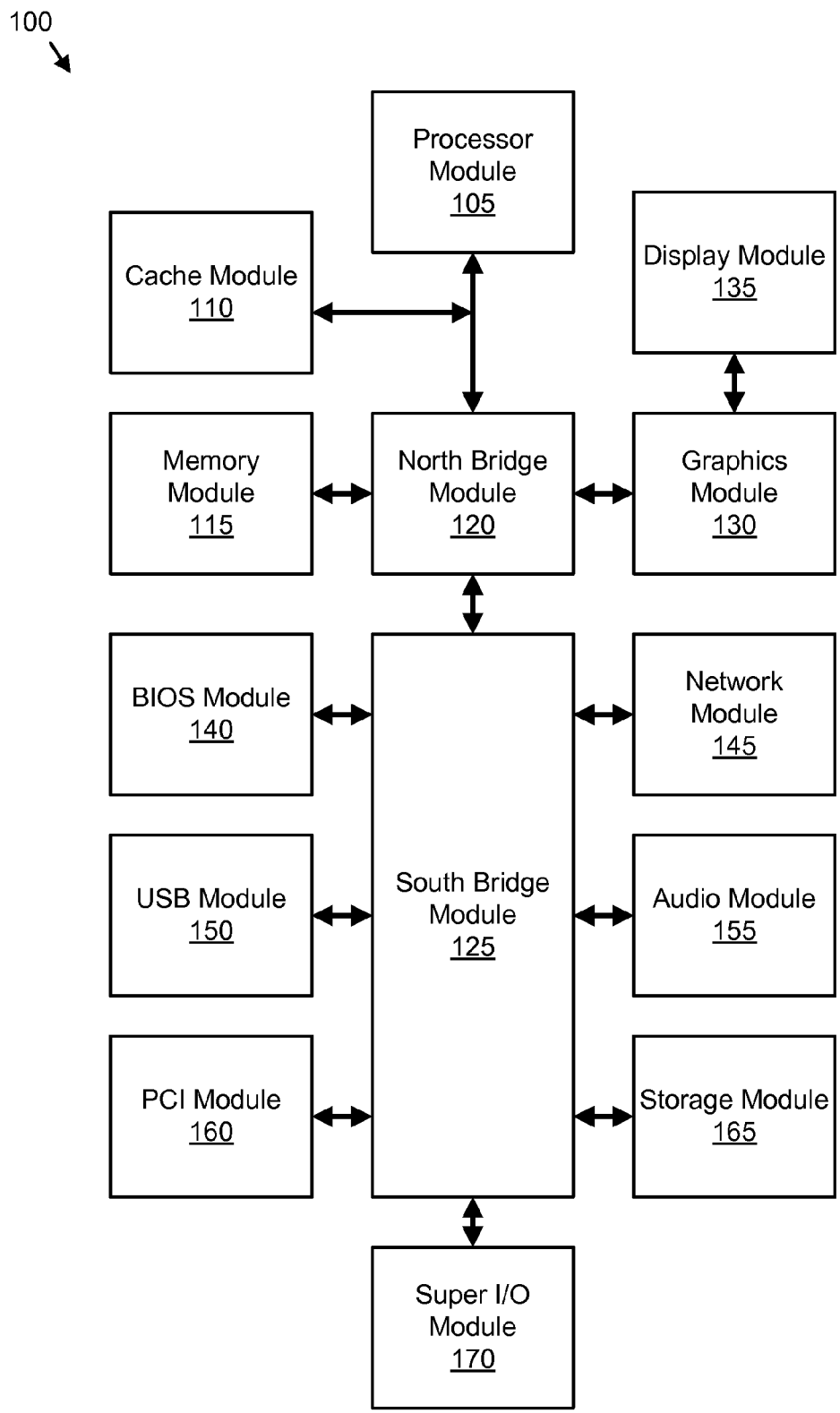
FIG. 1 is a schematic block diagram illustrating one embodiment of a computer in accordance with the present invention.

FIG. 1 is a schematic block diagram illustrating one embodiment of a computer 100 in accordance with the present invention. The computer 100 includes a processor module 105, a cache module 110, a memory module 115, a north bridge module 120, a south bridge module 125, a graphics module 130, a display module 135, a basic input/output system ("BIOS") module 140, a network module 145, a peripheral component interconnect ("PCI") module 160, a storage module 165, and a super input/output (I/O) module 170.

The processor module 105, cache module 110, memory module 115, north bridge module 120, south bridge module 125, graphics module 130, display module 135, BIOS module 140, network module 145, PCI module 160, storage module 165, and super I/O module 170, referred to herein as semiconductor modules, may be fabricated of semiconductor gates on one or more semiconductor substrates. Each semiconductor substrate may be packaged in one or more semiconductor devices mounted on circuit cards. Connections between the semiconductor modules may be through semiconductor metal layers, substrate-to-substrate wiring, circuit card traces, and/or wires connecting the semiconductor devices.

The memory module 115 stores software instructions and data. The processor module 105 executes the software instructions and manipulates the data as is well known to those skilled in the art. The software instructions and data may be configured as one or more computer readable programs. The computer readable programs may be tangibly stored in the storage module 165. The storage module 165 may be a hard disk drive, an optical storage device, a holographic storage device, a micromechanical storage device, a semiconductor storage device, or the like. Additional computer readable programs may comprise a BIOS and be tangibly stored in the BIOS module 140. The BIOS may be stored in flash memory on the BIOS module 140.

The north bridge module 120 may communicate with and provide bridging functionality between the processor module 105, the graphic module 130, the memory module 115, and the cache module 110. The processor module 105 may be connected to the north bridge module 120 over a, for example, six hundred sixty-seven Megahertz (667 MHz) processor bus.

The north bridge module 120 may be connected to the south bridge module 125 through a direct media interface (DMI) bus. The DMI bus may provide a high-speed, bi-directional, point-to-point link supporting a clock rate for example of one Gigabytes per second (1 GBps) in each direction between the north bridge module 120 and the south bridge module 125. The south bridge module 125 may support and communicate with the BIOS module 140, the network module 145, the PCI module 160, the storage module 165, and the super I/O module 170.

In one embodiment, upon initial power up, the processor module 105 may execute one or more computer readable programs from the BIOS module 140. The computer readable programs may test functions of the computer 100 and configure the computer 100. For example, the BIOS computer readable programs may test the cache module 110 and the memory module 115.

In the past, some tests could only be performed on the computer 100 using external test equipment. The present invention integrates the testing of components as will be described hereafter.

Figure 2:
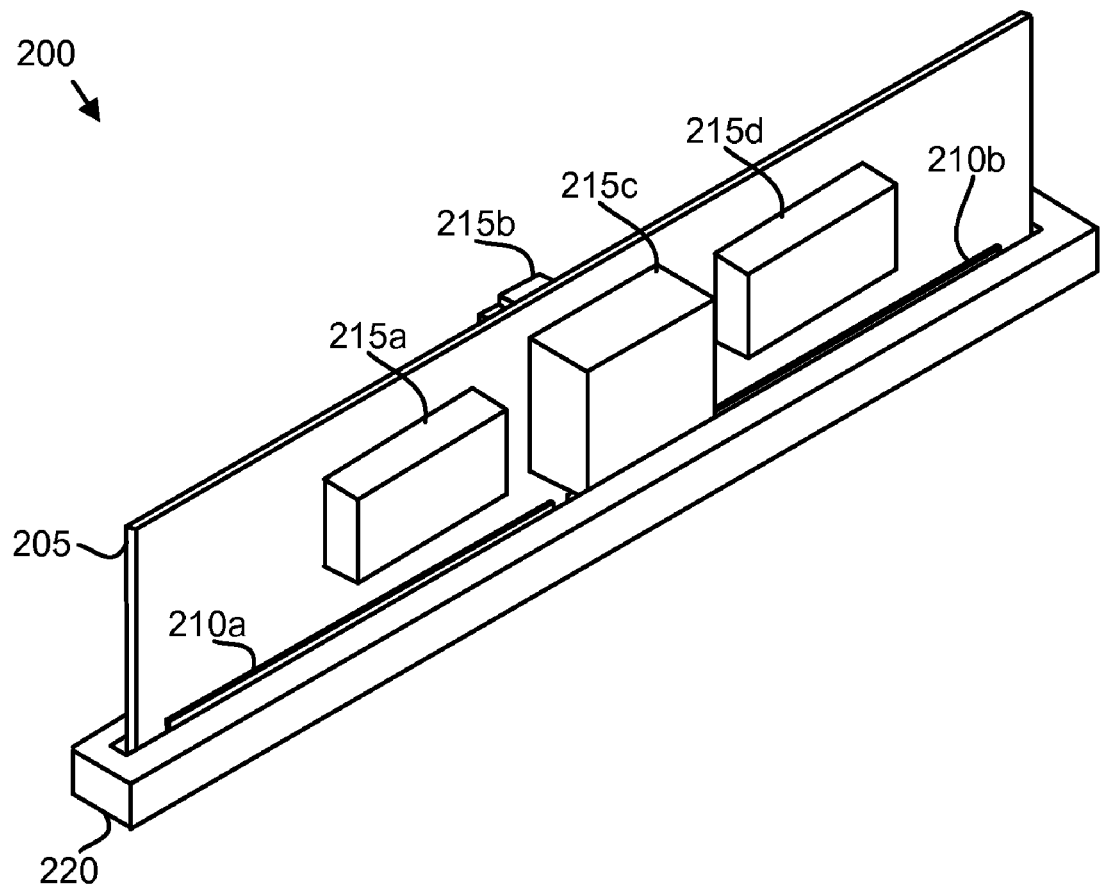
FIG. 2 is a schematic block diagram illustrating one embodiment of a dual in-line memory module (DIMM) of the present invention.

FIG. 2 is a schematic block diagram illustrating one embodiment of a DIMM 200 of the present invention. The DIMM 200 may be embodied by the memory module 115 FIG. 1. For example, the memory module 115 may comprise one or more DIMMs 200. The description of the DIMM 200 refers to elements of FIG. 1, like numbers referring to like elements. The DIMM 200 includes a circuit card 205, one or more edge card connectors 210, one or more semiconductor devices 215, and a connector 220.

The semiconductor devices 215 may be configured as dynamic random access memory (DRAM), a controller, and the like. The semiconductor devices 215 may store data for the computer 100. In addition, the semiconductor devices 215 may communicate through traces in the circuit card 205.

The connector 220 may mount to a motherboard of the computer 100. In addition, the connector 220 may communicate with the north bridge module 120 through one or more circuit board traces. The semiconductor devices 215 may exchange data with the computer 100 through the edge card connectors 210 and the connector 220. The DIMM 200 may include a 64-bit data path between the semiconductor devices 215 and the computer 100. The edge card connectors 210 may include 72, 144, 200, 168, 184, and 240 pins.

Figure 3:
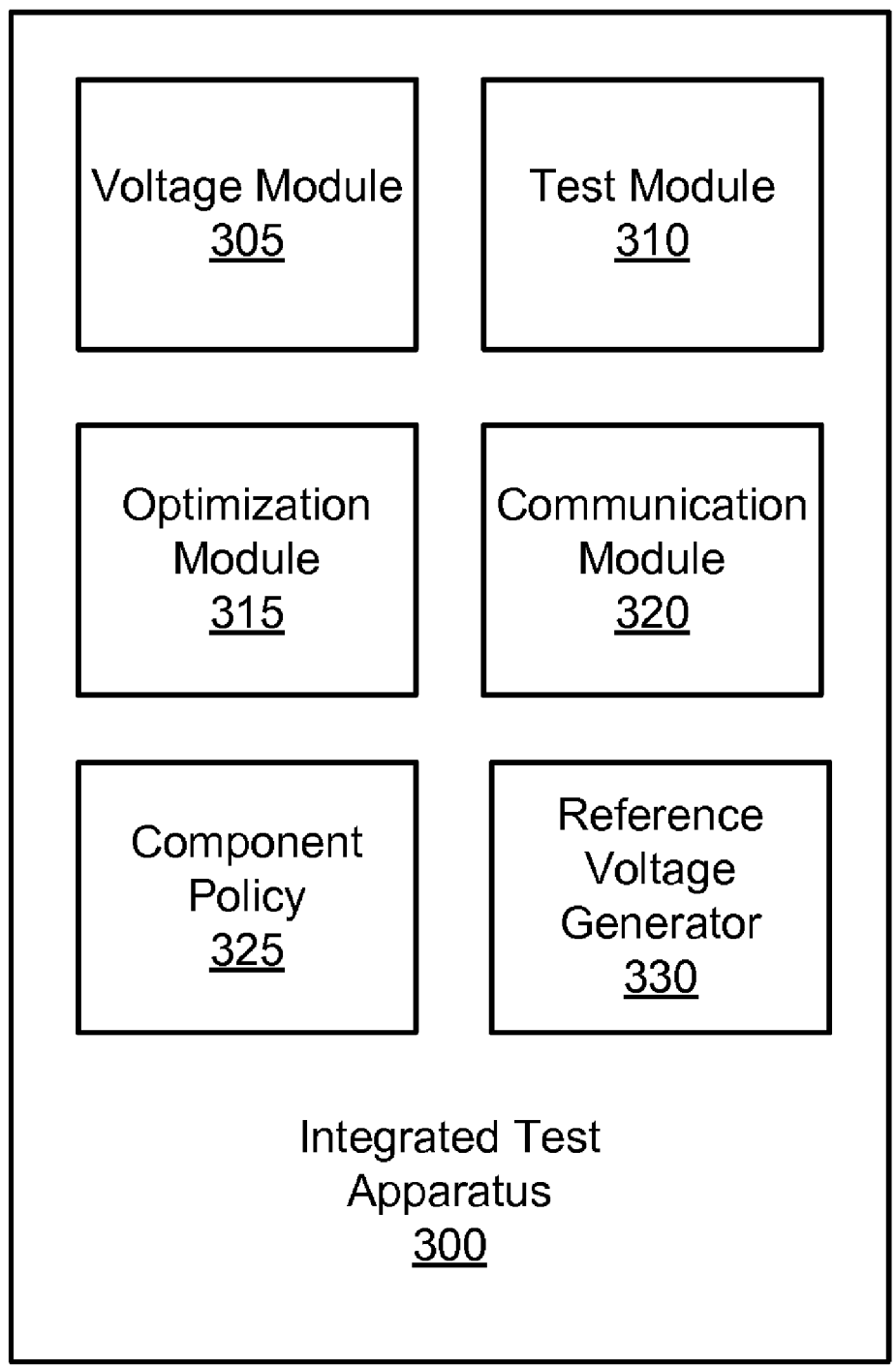
FIG. 3 is a schematic block diagram illustrating one embodiment of an integrated test apparatus of the present invention.

FIG. 3 is a schematic block diagram illustrating one embodiment of an integrated test apparatus 300 of the present invention. The integrated test apparatus 300 may be integrated into the computer 100 of FIG. 1. The description of the apparatus 300 refers to elements of FIGS. 1 and 2, like numbers referring to like elements. The apparatus 300 includes a voltage module 305, a test module 310, and optimization module 315, a communication module 320, a component policy 325, and a reference voltage generator 330.

The reference voltage generator 330 generates a reference voltage. In one embodiment, the reference voltage generator 330 includes a plurality of resistors arranged in a parallel array between a voltage source and a reference voltage node as will be described hereafter. The reference voltage generator 330 may be integrated within an electronic device such as the computer 100.

The voltage module 305 is also integrated within the electronic device. For example, the voltage module 305 may comprise a computer readable program executed by the processor module 105 of the computer 100. The computer readable program of the voltage module 305 may be stored in the BIOS module 140. The voltage module 305 modifies the reference voltage to a plurality of reference voltage values. In one embodiment, the voltage module 305 modifies a reference voltage by directing the reference voltage generator 330 to generate a specified voltage value. The voltage module 305 may direct the reference voltage generator 330 through the super I/O module 170. For example, the voltage module 305 may direct a reference voltage generator 330 to generate a 1.0 volt voltage value.

The test module 310 tests a component of the electronic device at each of the plurality of reference voltage values. In one embodiment, the test module 310 tests the component by determining if the component outputs a correct value. For example, the test module 310 may test the DIMM 200 by writing a known data word to the DIMM 200. The test module 310 may then read the data word from the DIMM 200. If the data word is incorrect, the DIMM 200 fails. The test module 310 tests the component at each of the plurality of reference voltage values.

The test module 310 may further determine a voltage range for the component. In one embodiment, the test module 310 may determine the voltage range when the electronic device is powered up. The voltage range comprises voltage values between a high voltage failure and a low voltage failure. For example, if the DIMM 200 fails at 1.5 Volts, but functions at 1.4 Volts, the high voltage failure may be 1.5 V. Similarly if the DIMM 200 fails at 0.3 V, but functions at 0.4 V, the low voltage failure may be 0.3 V.

The test module 310 is also integrated within the electronic device. In one embodiment, the test module 310 comprises the super I/O module 170. In addition, the test module 310 may comprise a computer readable program executed by the processor module 105. In one embodiment, the test module 310 comprises one or more computer readable programs stored in the BIOS module 140.

The optimization module 315 sets the reference voltage value to within the voltage range. The optimization module 315 is integrated within the electronic device. In one embodiment, the optimization module 315 may be integrated in the south bridge module 125 and/or the super I/O module 170. Alternatively, the optimization module 315 may comprise a computer readable program executed by the processor module 105. The computer readable program may be stored on the BIOS module 140.

The communication module 320 may communicate with the user. In one embodiment, the communication module 320 communicates an error message to the user if the voltage range violates a component policy. In a certain embodiment, the communication module 320 communicates the voltage range to the user. The communication module 320 may comprise one or more computer readable programs. The computer readable programs of the communication module 320 may also be stored on the BIOS module 140. In one embodiment, the communication module 320 communicates with the user by directing the processor module 105 to form a message and transmit the message through the graphics module 130 to the display module 135.

In one embodiment, the component policy 325 specifies an acceptable voltage range for the component. For example, the component policy 325 may require a voltage range of 1.5 Volts to 0.4 Volts for the DIMM 200. A component policy 325 may be stored in the storage module 165, the BIOS module 140, and/or the memory module 115. The apparatus 300 integrates testing of the component within the electronic device such as the computer 100 as will be described hereafter.

In one embodiment, a plurality of apparatuses 300 set a unique voltage value for each of a plurality of components within the electronic device. For example, a first apparatus 300 may set a voltage value for a processor module 105, a second apparatus 300 may set a voltage value for a first DIMM 200, a third apparatus 300 may set a voltage value for a second DIMM 200, a fourth apparatus 300 may set a voltage value for a third DIMM 200, and a fifth apparatus 300 may set a voltage value for a fourth DIMM 200.

Figure 4:
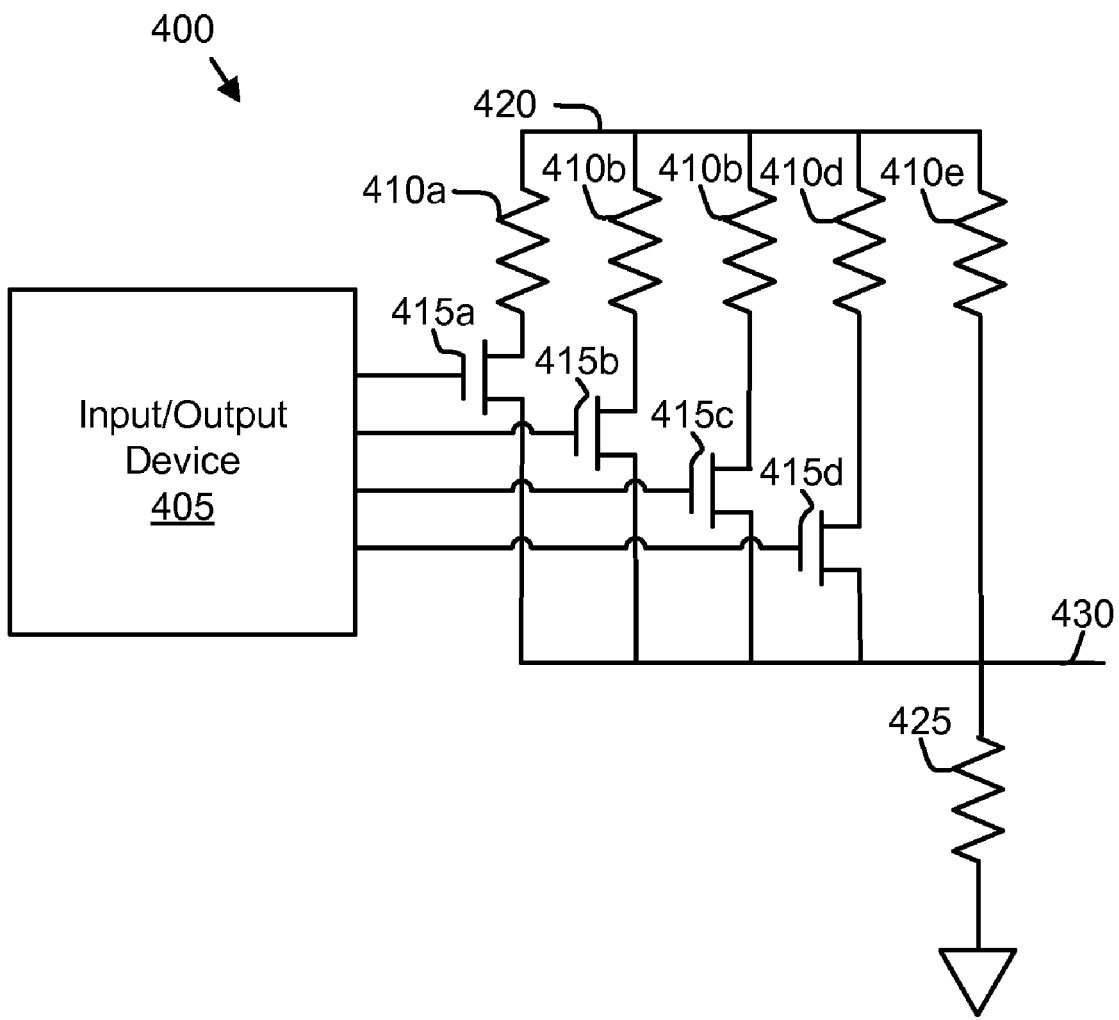
FIG. 4 is a schematic block diagram illustrating one embodiment of a parallel resistor array of the present invention.

FIG. 4 is a schematic block diagram illustrating one embodiment of a parallel resistor array 400 of the present invention. The parallel resistor array 400 is integral to an electronic device such as the computer 100. The reference voltage generator 330 of FIG. 3 may embody the parallel resistor array 400. In addition, the parallel resistor array 400 may be embodied in the super I/O chip 170 of FIG. 1. Alternatively, the parallel resistor array 400 may be a discrete semiconductor device in communication with the super I/O chip 170.

The description of the parallel resistor array 400 refers to elements of FIGS. 1-3, like numbers referring to like elements. The parallel resistor array 400 includes an I/O device 405, one or more resistors 410, a voltage source 420, one or more transistors 415, a reference voltage node 430, and a bias resistor 425.

The I/O device 405 may be integrated in the super I/O chip 170. In an alternate embodiment, the I/O device 405 is embodied in a discrete semiconductor device in communication with the super I/O chip 170.

Each of the resistors 410a-e may have a different resistance value. For example, a first resistor 410a may have a value of 400 ohms, a second resistor 410b may have a value of 100 ohms, a third resistor 410c may have a value of 22 ohms, a fourth resistor 410d a value of 10 ohms, and a fifth resistor 410e a value of 1000 ohms. The bias resistor 425 may also have a specified resistance value such as 50 ohms.

The voltage source 420 may have a specified voltage value. For example the voltage source 420 may have a voltage value of 2 V. Thus using the exemplary resistances described above, the parallel resistor array 400 may supply voltages at the reference voltage node 430 in the range of 0.04 Volts to 1.7 Volts. In one embodiment, the voltage source voltage value is greater than an expected high voltage failure value for any component.

In one embodiment, the I/O device 405 receives a voltage command. The voltage command may be a binary word, with one bit for each transistor 415. Alternatively, the voltage command may be one or more binary words specifying a voltage value. The Super I/O module 170 may receive the command through the south bridge module 125 and communicate the command to the I/O device 405.

The I/O device 405 may modify the reference voltage value of the reference voltage node 430 by turning transistors 415 on and off. Continuing the example above, by turning on a fourth transistor 415d and turning off first, second, and third transistors 415a-c, the voltage value of the reference voltage node 430 is approximately 0.33 Volts. One of skill in the art will appreciate that although only five resistors 410 and four transistors 415 are shown, any number of resistor 410/transistor 415 combinations may be employed various voltage source values and bias resistors 425 to generate a range of reference voltage values at the reference voltage node 430.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 5:
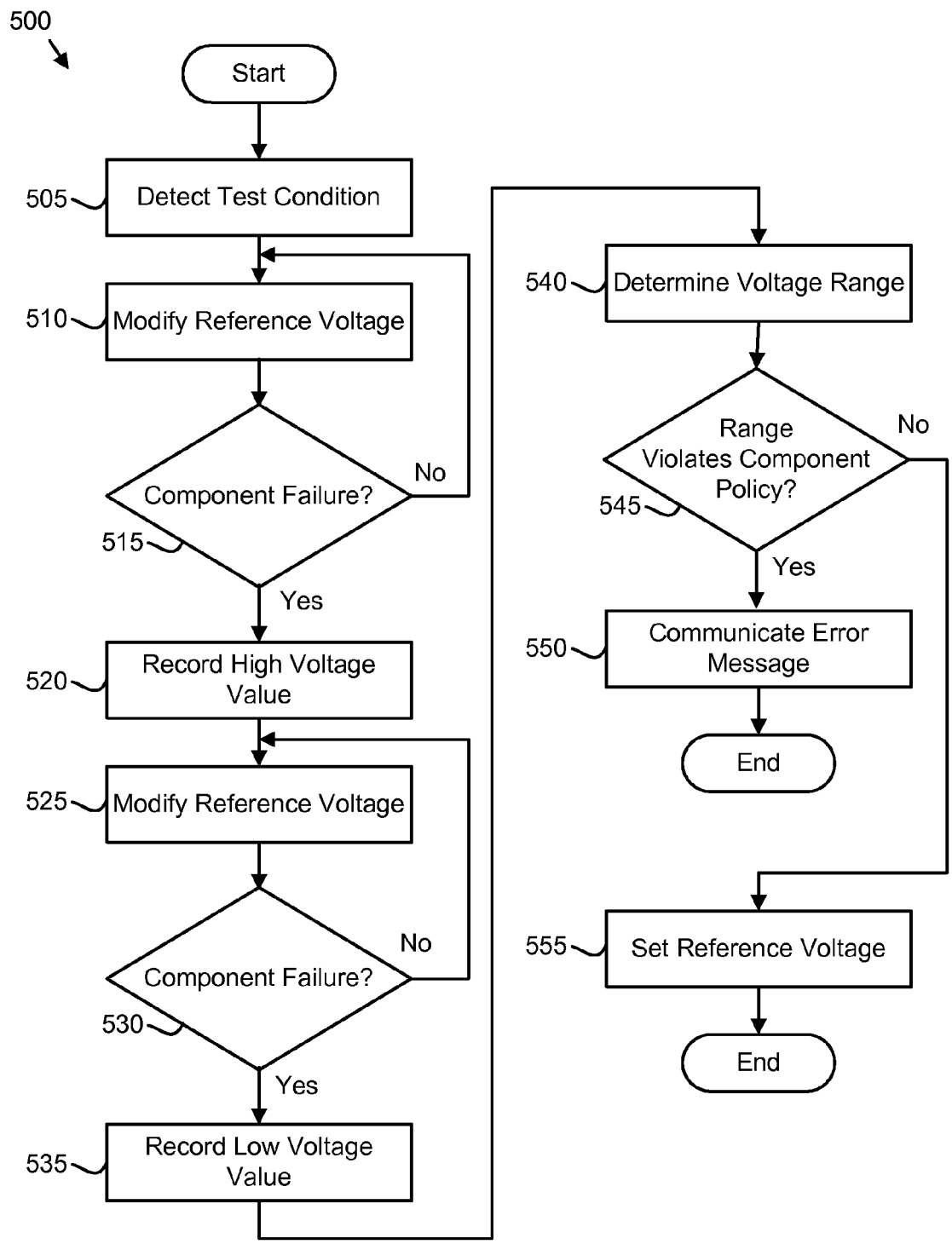
FIG. 5 is a schematic flow chart diagram illustrating one embodiment of a integrated component testing method of the present invention.

FIG. 5 is a schematic flow chart diagram illustrating one embodiment of an integrated component testing method 500 of the present invention. The method 500 substantially includes the steps to carry out the functions presented above with respect to the operation of the described apparatus and system of FIGS. 1-4. The description of the method 500 refers to elements of FIGS. 1-4, like numbers referring to like elements. In one embodiment, the method is implemented with a computer program product comprising a computer readable medium having a computer readable program. The computer readable program may be integrated into a computing system, such as the BIOS code stored on the BIOS module 140 and executed by the processor module 105, wherein the program in combination with the computing system is capable of performing the method 500.

The method 500 begins, and in one embodiment, the test module 310 detects 505 a test condition. The test module 310 may detect 505 the electronic device powering up as the test condition. For example, the test module 310 may detect 505 the computer 100 powering up as the test condition. In a certain embodiment, the test module 310 detects 505 a first power up during production as the test condition.

Alternatively, a user may communicate the test condition to the test module 310. For example, a user may direct the computer 100 to test the component by issuing a command through a diagnostic graphical user interface (GUI). The diagnostic GUI may be accessed as part of one or more diagnostic utilities. In an alternate embodiment, the diagnostic GUI is accessible during power up.

In one embodiment, the test condition is the installation of a new component. For example, the test module 310 may detect the installation of a new DIMM 200. The test module 310 may test components such as the newly installed DIMM 200.

The voltage module 305 modifies 510 the reference voltage. The reference voltage is the voltage value at the reference voltage node 430. The reference voltage generator 330 may generate the reference voltage. In a certain embodiment, the reference voltage is generated by the parallel resistor array 400. The reference voltage is integral to the electronic device. The voltage module 305 modifies 510 the reference voltage to a plurality of reference voltage values. In one embodiment, the voltage module 305 modifies 510 the reference voltage by turning on and turning off select transistors 415 in the parallel resistor array 400.

For example, the voltage module 305 may cause the third transistor 415c to turn on and the first, second, fourth transistors 415a, b, d to turn off to produce a reference voltage of 0.6 Volts. The voltage module 305 may then turn off the third transistor 415c and turn on the second transistor 415b to produce a reference voltage of 1.3 Volts. Finally, the voltage module 305 may turn off the second transistor 415b and turn on the first transistor 415a to produce a reference voltage of 1.7 Volts. One of skill in the art will recognize that additional transistors 415 and additional resistor 410 combinations may be used to produce a broader voltage range and/or finer steps between the discrete reference voltage values.

The test module 310 tests 515 the component of the electronic device for a component failure at each of the plurality of reference voltage values. Continuing the example above, on the test module 310 may test 515 the DIMM 200 at 0.6 Volts, 1.3 Volts, and 1.7 Volts. The test module 310 may determine whether the DIMM 200 can store and retrieve data at the specified reference voltage.

If the component does not fail, the voltage module 305 modifies 510 the reference voltage to a new higher value and the test module 310 again tests 515 the component for failure. If the component fails, the test module 310 records the reference voltage as the high voltage value. For example, if the DIMM 200 fail to correctly store and retrieve data at 1.7 Volts, the test module 310 may record 520 1.7 Volts as the high voltage value.

The voltage module 305 again modifies 525 the reference voltage. For example, the voltage module 305 may cause the second transistor 415b to turn on and the first, third, and fourth transistors 415a, c, d to turn off to produce a reference voltage of 1.3 Volts. The voltage module 305 may then turn off the second transistor 415b and turn on the third transistor 415c to produce a reference voltage of 0.6 volts. Finally, the voltage module 305 may turn off the third transistor 415c and turn on the fourth transistor 415d to produce a reference voltage of 0.3 Volts.

The test module 310 tests 530 the component for a component failure at each of the plurality of reference voltage values. Continuing the example above, on the test module 310 may test 515 the DIMM 200 at 1.3 Volts, 0.6 Volts, and 0.3 Volts. The test module 310 may determine whether the DIMM 200 can store and retrieve data at the specified reference voltage.

If the component does not fail, the voltage module 305 modifies 525 the reference voltage to a new lower value and the test module 310 again tests 530 the component for failure. If the component fails, the test module 310 records the reference voltage as the low voltage value. For example, if the DIMM 200 fail to correctly store and retrieve data at 0.3 Volts, the test module 310 may record 535 0.3 Volts as the low voltage value.

The test module 310 determines 540 a voltage range for the component. The voltage range may be the voltage values between the high voltage failure and the low voltage failure. Alternative, the voltage range is the range between the lowest and highest voltages where the component did not fail.

The test module 310 determines 545 if the voltage range violates the component policy 325. In one embodiment, the component policy 325 specifies that a voltage range for each component type. For example, a component policy 325 may specify a first voltage range for a 200 MHz DDR SDRAM and a second voltage range for a 400 MHz DDR2 SDRAM. Alternatively, the component policy 325 may specify a voltage range for all components of a type used by the electronic device. For example, the component policy 325 may specify a voltage range of 0.4 Volts to 1.4 Volts for all DIMMs 200.

If the test module 310 determines 545 that the voltage range violates the component policy 325, the communication module 320 may communicate 550 an error message to the user and the method 500 ends. For example, the communication module 320 may communicate 550 that the DIMM 200 is out of specification. In a certain embodiment, the communication module 320 logs an error message in a log file. If the test module 310 determined 545 that the voltage range does not violate the component policy 325, the optimization module 315 sets 555 the reference voltage of the reference voltage node 430 and the method 500 ends.

In one embodiment, the optimization module 315 sets 555 the reference voltage to the midpoint of the voltage range. For example, if the voltage range is 0.5 Volts into 1.5 Volts, the optimization module 315 may set 555 the reference voltage to the voltage value of 1 Volts.

In an alternate embodiment, the optimization module 315 sets 555 the reference voltage to a target value within the voltage range. For example, the 400 MHz DDR2 SDRAM may have a target voltage of 1.1 Volts. The optimization module 315 may set 555 the reference voltage to 1.1 Volts if 1.1 Volts is within the voltage range.

The method 500 allows the integrated testing of components within the electronic device. For example, a component such as a DIMM 200 may be tested within the computer 100 without additional test hardware using devices integral to the computer 100. The method 500 reduces the cost of component test. In addition, the method 500 allows users other than the manufacturer to test the component.

Figure 6:
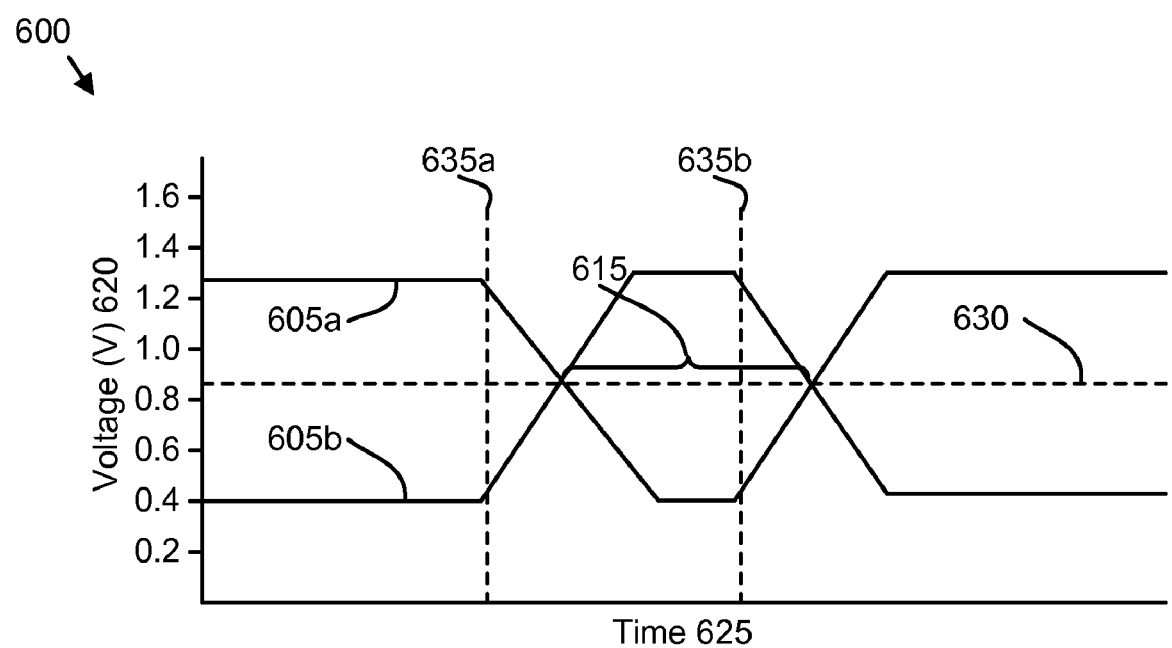
FIG. 6 is a diagram illustrating one embodiment of a voltage range plot in accordance with the present invention.

FIG. 6 is a diagram illustrating one embodiment of a voltage range plot 600 of the present invention. The plot 600 shows the reference voltage 630 and first and second output voltage 605a-b. The output voltages 605 may be from the component. The component may be the DIMM 200.

The output voltages 605a-b and a reference voltage 630 are shown measured in volts 620 over time 625. The time 625 may be measured in nanoseconds. The output voltages 605 are shown switching at a first and second switching time 635a-b. The interval between when each output voltage 605 crosses the reference voltage 630 after the first switching time 635a and after the second switching time 635b is referred to as the eye width 615. In one embodiment, the test module 310 determines there is a component failure if the eye width 615 is either too long or too short.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for integrated component testing, the apparatus comprising:

a voltage module integrated within an electronic device that modifies a reference voltage to a plurality of reference voltage values, wherein the reference voltage is integral to the electronic device;

a test module integrated within the electronic device that applies each of the plurality of reference voltage values to a component of the electronic device, that tests the component of the electronic device at each of the plurality of reference voltage values, and that determines a voltage range for the component, wherein the voltage range comprises voltage values between a high voltage failure value and a low voltage failure value, the high voltage failure value comprising a highest value of the plurality of reference voltage values at which the test of the component did not fail, the low voltage failure value comprising a lowest value of the plurality of reference values at which the test of the component did not fail; and an optimization module integrated within the electronic device that sets the reference voltage value to within the voltage range.

2. The apparatus of claim 1, further comprising a communication module configured to communicate an error message to a user if the voltage range violates a component policy.

3. The apparatus of claim 2, wherein a plurality of apparatuses set a unique voltage value for each of a plurality of components within the electronic device.

4. The apparatus of claim 1, wherein the test module determines the voltage range when the electronic device is powered up.

5. The apparatus of claim 1, wherein the component is a new component and the test module detects the new component and determines the voltage range in response to detecting the new component.

6. The apparatus of claim 1, wherein the optimization module sets the reference voltage value to a midpoint of the voltage range.

7. The apparatus of claim 1, wherein the optimization module sets the reference voltage value to a target value within the voltage range.

8. The apparatus of claim 1, wherein the voltage module comprises a plurality of resistors arranged in a parallel array between a voltage source and a reference voltage node, wherein at least one resistor is switched out of the parallel array by at least one transistor controlled by an input/output device.

9. The apparatus of claim 8, wherein the input/output device controls the at least one transistor in response to commands from a Basic Input/Output System (BIOS).

10. The apparatus of claim 8, further comprising a bias resistance between the reference voltage node and a common node.

11. A computer program product comprising a computer useable medium having a computer readable program, wherein the computer readable program when executed on a computer causes the computer to:
   modify a reference voltage integral to the computer to a plurality of reference voltage values;
   apply each of the plurality of reference voltage values to a component of the computer;
   test the component of the computer at each of the plurality of reference voltage values;
   determine a voltage range for the component, wherein the voltage range comprises voltage values between a high voltage failure value and a low voltage failure value, the high voltage failure value comprising a highest value of the plurality of reference voltage values at which the test of the component did not fail, the low voltage failure value comprising a lowest value of the plurality of reference values at which the test of the component did not fail; and
   set the reference voltage value to within the voltage range.

12. The computer program product of claim 11, wherein the computer readable program is further configured to cause the computer to communicate an error message to a user if the voltage range violates a component policy.

13. The computer program product of claim 12, wherein the computer readable program is further configured to cause the computer to communicate the voltage range.

14. The computer program product of claim 11, wherein the computer readable program is further configured to cause the computer to determine the voltage range when the computer is powered up.

15. The computer program product of claim 11, wherein the component is a new component and the computer readable program is further configured to cause the computer to detect the new component and determine the voltage range in response to detecting the new component.

16. The computer program product of claim 11, wherein the computer readable program is further configured to cause the computer to set the reference voltage value to a voltage value selected from a midpoint of the voltage range and a target value within the voltage range.

17. A system for integrated component testing, the system comprising:
   a reference voltage generator configured to generate a reference voltage;
   a component;
   a voltage module that modifies the reference voltage to a plurality of reference voltage values;
   a test module that applies each of the plurality of reference voltage values to a component of the electronic device, that tests the component at each of the plurality of reference voltage values, and that determines a voltage range for the component, wherein the voltage range comprises voltage values between a high voltage failure value and a low voltage failure value, the high voltage failure value comprising a highest value of the plurality of reference voltage values at which the test of the component did not fail, the low voltage failure value comprising a lowest value of the plurality of reference values at which the test of the component did not fail; and
   an optimization module that sets the reference voltage value to within the voltage range.

18. The system of claim 17, wherein the system is configured as a computer.

19. The system of claim 17, wherein the component is configured as a dual in-line memory module (DIMM).

20. A method for deploying computer infrastructure, comprising integrating computer readable program into a computing system, wherein the program in combination with the computing system is capable of performing the following:
   modifying a reference voltage integral to the computing system to a plurality of reference voltage values;
   applying each of the plurality of reference voltage values to a DIMM of a computing system;
   testing the DIMM of the computing system at each of the plurality of reference voltage values;
   determining a voltage range for the DIMM, wherein the voltage range comprises voltage values between a high voltage failure value and a low voltage failure value, the high voltage failure value comprising a highest value of the plurality of reference voltage values at which the test of the component did not fail, the low voltage failure value comprising a lowest value of the plurality of reference values at which the test of the component did not fail; and
   communicating an error message to a user if the voltage range violates a component policy; and
   setting the reference voltage value to a voltage value selected from a midpoint of the voltage range and a target value within the voltage range.

* * * * *